(12) United States Patent
Baker et al.

(10) Patent No.: US 7,434,124 B2
(45) Date of Patent: Oct. 7, 2008

(54) REDUCED PATTERN MEMORY IN DIGITAL TEST EQUIPMENT

(75) Inventors: Daniel J. Baker, Austin, TX (US); J. Christopher White, Austin, TX (US); Ciro T. Nishiguchi, Austin, TX (US)

(73) Assignee: National Instruments Corporation, Austin, TX (US)

( * ) Notice: Subject to any disclaimer, the term of this patent is extended or adjusted under 35 U.S.C. 154(b) by 382 days.

(21) Appl. No.: 11/391,009

(22) Filed: Mar. 28, 2006

(65) Prior Publication Data

US 2007/0234145 A1 Oct. 4, 2007

(51) Int. Cl.
*G01R 31/28* (2006.01)

(52) U.S. Cl. .......................... 714/724; 714/30

(58) Field of Classification Search .................... 714/38, 714/724, 30; 257/48; 702/117; 709/214
See application file for complete search history.

(56) References Cited

U.S. PATENT DOCUMENTS

| | | | |
|---|---|---|---|
| 6,202,186 B1 * | 3/2001 | Oonk | 714/738 |
| 6,486,493 B2 * | 11/2002 | Arimoto et al. | 257/48 |
| 6,499,126 B1 * | 12/2002 | Tsuto | 714/738 |
| 7,032,145 B1 * | 4/2006 | Burlison | 714/724 |
| 7,092,837 B1 * | 8/2006 | Lanier et al. | 702/117 |
| 7,266,587 B2 * | 9/2007 | Rowlands | 709/214 |
| 7,277,307 B1 | 10/2007 | Yelluru | |
| 7,280,420 B2 | 10/2007 | Santin | |

* cited by examiner

*Primary Examiner*—David Ton
(74) *Attorney, Agent, or Firm*—Meyertons Hood Kivlin Kowert & Goetzel, P.C.; Jeffrey C. Hood; Erik A. Heter

(57) ABSTRACT

A test system and method of configuring therefor. A test system includes a plurality of interface circuits for communicating with a device under test (DUT). The test system further includes a first memory for storing test vectors, a second memory for storing selection codes, and a third memory for storing configuration sets. Each selection code indicates an association between a test vector and a configuration set. Each configuration set may be associated with one or more of the test vectors. The configuration sets include information for configuring the interface circuits during communications between the test system and the DUT for each test vector. Each configuration set in the third memory is unique with respect to the other configuration sets, and the number of configuration sets may be less than the number of test vectors.

41 Claims, 6 Drawing Sheets

REDUCED PATTERN MEMORY IN DIGITAL TEST EQUIPMENT

BACKGROUND OF THE INVENTION

1. Field of the Invention

This invention relates to electronic systems, and more particularly, to the testing of electronic systems.

2. Description of the Related Art

Digital test equipment is used to test electronic systems, printed circuit assemblies, and integrated circuits in order to detect the presence of various manufacturing defects and to ensure proper operation. During the test process, digital test systems typically drive stimuli to a device under test (DUT) in the form of test vectors. The common values for each bit in a test vector may be either a logic low (i.e. 0), logic high (i.e. 1), or a high impedance (Z). Similarly, digital test systems may commonly be configured to receive data from the DUT in the form of a logic 0, logic 1, or a high impedance value. Other possible test values that may be transmitted and/or received by a test system include intermediate voltages (i.e. between a logic low and a logic high), values with varied timing, and so forth. In general, values that may be transmitted or received include any signal values that may be used to verify the proper functioning of the tested circuitry within voltage, current, and timing requirements.

For test vectors that are driven to the DUT, a digital test system typically utilizes a tri-stateable pin driver. FIG. 1 shows an exemplary test system having a bi-directional channel coupled to a DUT. In the embodiment shown, the test system includes a pattern memory coupled to an application specific integrated circuit (ASIC) or field programmable gate array (FPGA). The ASIC/FPGA is coupled to a driver and a receiver, both of which are coupled to a bi-directional signal line, which in turn is coupled to a DUT. The driver is configured to drive signals to the DUT, while the receiver is configured to receive signals from the DUT. The receiver is also coupled to a comparison circuit in order to allow comparison of received data with expected data. The driver, receiver, and bi-directional signal line may each be one of a number of communication channels used for coupling the test system to the DUT. It is also noted that channels coupled to unidirectional signal lines (with only a driver or receiver coupled thereto) are also possible and contemplated.

The pattern memory for the embodiment shown, as indicated in the table, is configured to store data bits for driving to the test system or comparing with bits received from the test system, driver enable bits, and compare enable bits. Each of these bits in the columns shown is a part of a vector. A group of data bits such as those shown in column A may make up a vector to be driven to the DUT and/or compared with data received from the DUT. The pattern memory may also comprise a drive enable vector that indicates which channels are to be enabled when driving data to the DUT, or a compare enable vector indicating from which channels data received from the DUT is to be compared or monitored. In the table shown in FIG. 1, a logic 1 in the driver enable column (B) indicates that the logic value indicated in the data bit column (A) is to be driven to the DUT. Similarly, a logic 1 in the compare enable column (C) indicates that comparison circuitry is to compare the logic value of a received signal to the value indicated in the data bit column. An "X" in the data bit column indicates that the channel is at a high impedance ('Hi-Z') state and no comparison is made ("don't care").

Since the pattern memory stores a compare enable bit and a drive enable bit for each data bit, the pattern memory for the embodiment shown requires three times the storage than would be required to store the data bits alone. The amount of storage required is even greater when test vectors to be driven to the DUT are different from response vectors to be compared with data received from the DUT, which may be the case. Even in embodiments where the tester is connected to a unidirectional signal node of a DUT, storing an associated enable vector for each data vector requires twice the memory and twice the bus width. Thus, this bandwidth requirement becomes more inefficient and less cost effective in light of the increasing complexity of electronic systems and integrated circuits.

SUMMARY OF THE INVENTION

A test system and method of configuring a test system are disclosed. In one embodiment, a test system includes a plurality of interface circuits for communicating with a device under test (DUT). The test system further includes a first memory for storing test vectors, a second memory for storing selection codes, and a third memory for storing configuration sets. Each selection code indicates an association between a test vector and a configuration set. Each configuration set may be associated with one or more of the test vectors. The configuration sets include information for configuring the interface circuits during communications between the test system and the DUT for each test vector. Each configuration set in the third memory is unique with respect to the other configuration sets, and the number of configuration sets is less than the number of test vectors.

A method of operating the test system includes retrieving a test vector from a first memory, retrieving a selection code associated with the test vector from a second memory, and retrieving a configuration set from a third memory based on the selection code. The method further includes configuring the interface circuits of the test system for communications with the DUT in accordance with the information in the configuration set.

A method for configuring the test system includes generating a plurality of test vectors and generating a first plurality of configuration sets for each of the test vectors. The method further includes determining which of the configuration sets are common for two or more test vectors (i.e. redundant), and reducing the number of configuration sets to produce a second plurality thereof, wherein each configuration set in the second plurality is unique (i.e. only on occurrence thereof) with respect to the other configuration sets of the second plurality. Selection codes are then generated to associate each of the test vectors with one of the configuration sets, wherein some configuration sets are associated with more than one test vector. The test vectors are stored in a first memory of the test system, the selection codes in a second memory of the test system, and the configuration sets in a third memory of the test system.

The interface circuits may include drivers, receivers, or both. The configuration information may include enable information indicating which interface circuits are to be enabled for communications between the test system and the DUT. Enable information may include drive enable information indicating which drivers are to be enabled when driving a given test vector to the DUT. Some configuration sets may include compare enable information indicating which of a plurality of comparison circuits in the test system are to be enabled to allow comparison of a test vector to data received from the DUT. Configuration sets may include additional information as well. Such information may include voltage levels for signals to be driven to the DUT, drive strength levels (e.g., whether to drive a logic '1' strongly or weakly), timing information (e.g., when within a given period to drive a signal or to compare with a received signal), format information, current loading information, and so forth. In general, a configuration set may include any information necessary for performing a desired test on a DUT.

The methods and apparatus described herein may be used with a wide variety of electronic test systems, including test systems where the DUT is an integrated circuit and test systems wherein the DUT is printed circuit assembly.

BRIEF DESCRIPTION OF THE DRAWINGS

Other aspects of the invention will become apparent upon reading the following detailed description and upon reference to the accompanying drawings in which.

Figure 1:
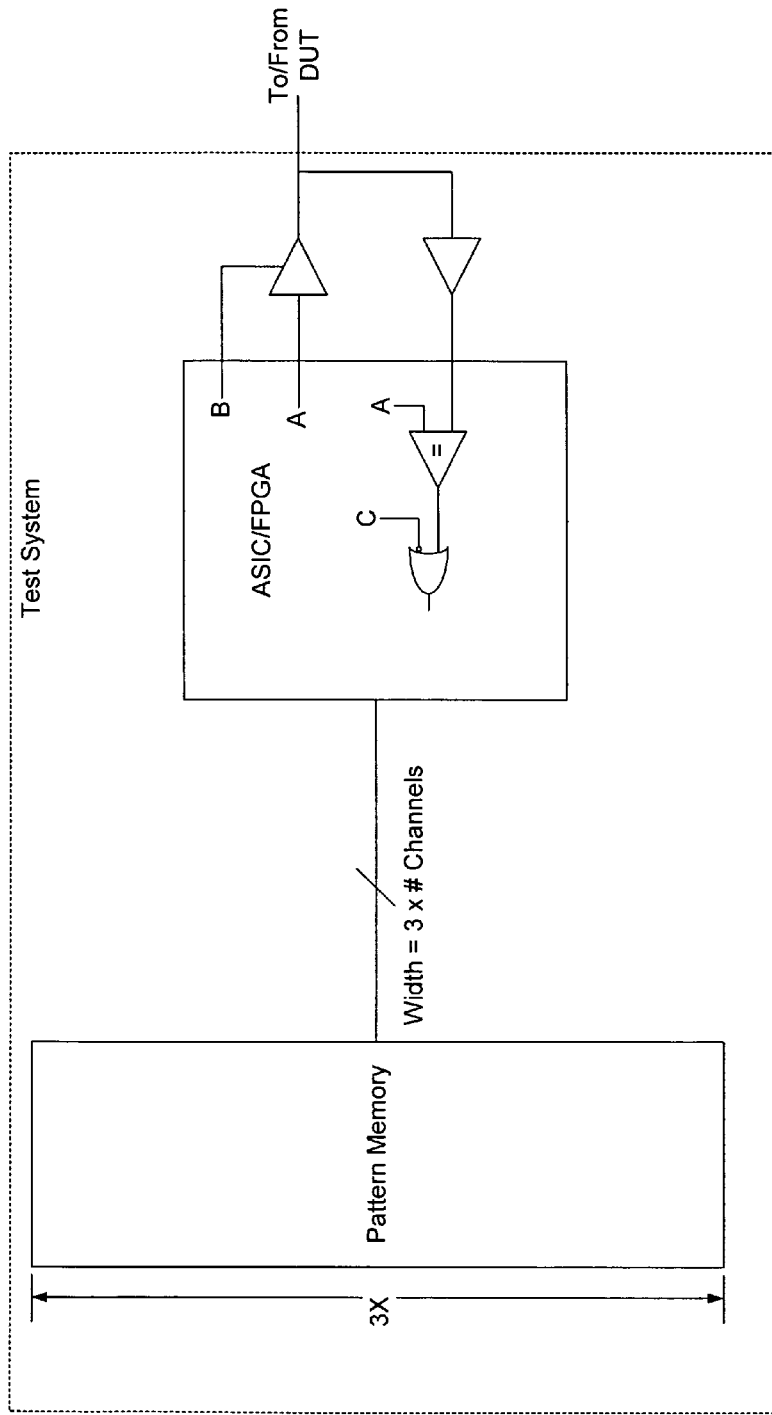
FIG. 1 (Prior Art) is a drawing of one embodiment of a test system.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
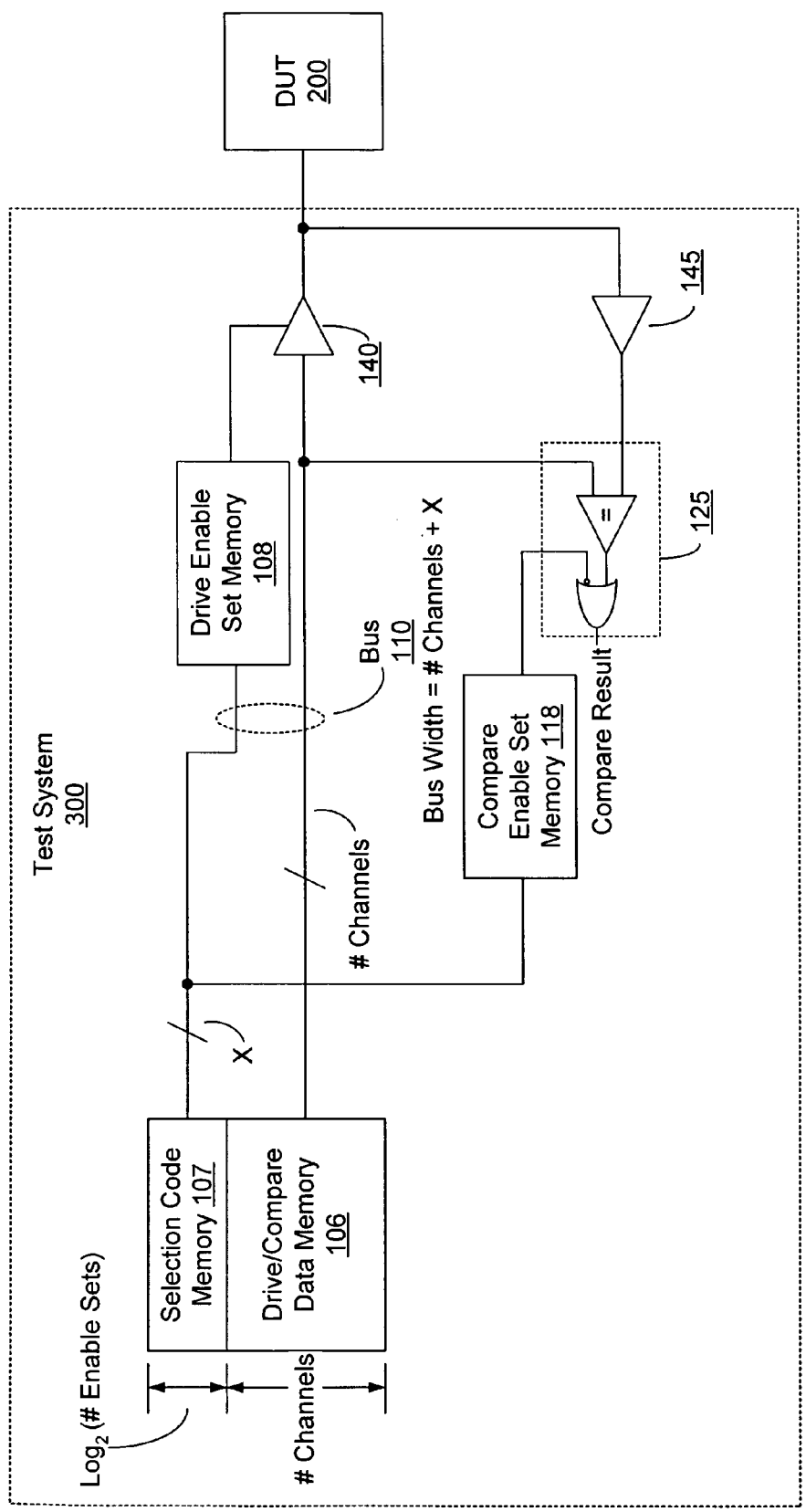
FIG. 2 is a drawing of one embodiment of a test system having a reduced pattern memory and lower bus width-to-channel ratio.

Turning now to FIG. 2, a drawing of an embodiment of a test system is shown. In the embodiment shown, test system 300 includes a drive/compare data memory 106, a selection code memory 107, a drive enable set memory 108 and a compare enable set memory 118. Test system 300 also includes a plurality of drivers 140, a plurality of receivers 145, a plurality of comparison circuits 125. For the sake of simplicity, only one each of the drivers 140, receivers 145, and comparison circuits 125 are shown here, although it is understood that multiple instances of each may be present. The driver/receiver connects to the DUT may be unidirectional, as will be discussed below.

Before discussing test system 300 in further detail it is necessary to discuss the concept of drive/compare enable set reduction. Tables 1 and 2 below illustrate the concept of drive/compare enable set reduction accomplished by the embodiment shown in FIG. 2. Table 1 below shows a plurality of exemplary test vectors. Each test vector includes a plurality of bit positions associated with a driver of a test system. The output of each associated driver can be a logic 0, a logic 1, or a high-Z output. Table 2 illustrates a plurality of drive enable sets, each of which is associated with a test vector in Table 1.

TABLE 1

| Vector | Ch7 | Ch6 | Ch5 | Ch4 | Ch3 | Ch2 | Ch1 | Ch0 |
|---|---|---|---|---|---|---|---|---|
| 0 | Z | Z | Z | Z | Z | Z | Z | Z |
| 1 | Z | Z | 1 | 0 | 1 | 0 | Z | 0 |
| 2 | 0 | Z | Z | 1 | Z | 1 | 0 | 0 |
| 3 | 1 | 0 | 0 | 0 | 1 | 1 | 0 | 1 |
| 4 | Z | Z | 0 | 1 | 0 | 0 | Z | 0 |
| 5 | 1 | Z | Z | 1 | Z | 1 | 1 | 1 |

Table 2 illustrates the drive enable sets for each of test vectors 0-5. For the purposes of this table, the data to be driven is set to a logic 0 for each high-Z state, with all of the data coded in hexadecimal format.

TABLE 2

| Vector # | Drive Data | Drive Enable | Enable Set # |
|---|---|---|---|
| 0 | 0x00 | 0x00 | Set 0 |
| 1 | 0x28 | 0x3D | Set 1 |
| 2 | 0x14 | 0x97 | Set 2 |
| 3 | 0x8D | 0xFF | Set 3 |
| 4 | 0x10 | 0x3D | Set 1 |
| 5 | 0x97 | 0x97 | Set 2 |

As can be seen from examining Table 2, test vectors 1 and 4 utilize the same combination of drive enables, and thus the same enable set (enable set #1 in this case), even though the test vectors themselves are different. Similarly, test vectors 2 and 5, despite being different with respect to each other, both utilize a combination of drive enables corresponding to enable set #2. Thus, instead of storing multiple instances of enable sets #1 and #2, each of these enable sets can be stored a single time and then associated with the appropriate test vectors by a selection code (selection codes will be discussed in further detail below). For larger groups of test vectors, storing a single instance of a drive enable set for a plurality of test vectors may result in a significant savings of required memory space that would otherwise be required if the drive enable set was to be stored once for each individual test vector.

The maximum desired number of unique enable sets determines the width of the internal data bus. For example, if the bus width is 32 bits and the number of channels available for coupling test system 300 to DUT 200 is 20, each selection code may include up to 12 bits. The number of bits used for selection codes corresponds to the total number of possible unique drive enable sets. For the example given herein the total number of bits reserved for unique drive enable sets (some of which may be common to two or more test vectors) is $2^{12}$. Thus, in the embodiment shown in FIG. 2, the width of bus 110 (32 bits) is the number of channels (# channels=20)+X (where X is the number of bits required by a selection code, which can be up to 12 in this example).

Test system 300, in the particular embodiment shown, is coupled to a DUT 200 through a plurality of bi-directional signal lines. Data from test system 300 may be driven to DUT 200 via one of a plurality of drivers 140, and may be received from DUT 200 via a plurality of receivers 145. It is to be understood that some signal connections of DUT 200 may be unidirectional. Such unidirectional signal connections may be either inputs or outputs. In such instances, only one of either a driver 140 or a receiver 145 need be present in test system 300 for each unidirectional connection. However, both driver 140 and receiver 145 may be present even for a unidirectional connection, with the understanding that only the applicable driver or receiver is used for communications over that channel between test system 300 and DUT 200.

As noted above, the embodiment shown includes drive/compare data memory 106. This memory may be used to store test vectors to be driven to DUT 200 by test system 300, and may also be used to store compare data vectors used for comparisons with response data vectors received from DUT 200. The width of this memory may be equal to the number of channels that are used to couple test system 300 to DUT 200. Each test vector or compare data vector is associated with a selection code stored in selection code memory 107. In this embodiment, the width of selection code memory 107 is equal to the value of $\log_2$ (number of possible unique enable sets). It is noted that the value of $\log_2$ (number of possible unique enable sets) is rounded up to the next whole number if the value is otherwise not a whole number. The number of possible unique enable sets may refer to the number of enable sets that may be stored in drive enable set memory 108, compare enable set memory 118, or both. The selection codes may be associated with at least one drive enable set and/or at least one compare enable set.

When a test vector is to be driven to DUT 200, the test vector is accessed from drive/compare data memory 106 and its associated selection code is accessed from selection code memory 107. Each data bit of the test vector is conveyed to a driver 140, while the selection code it conveyed to drive enable set memory 108. The selection code may be an address that is used to access the drive enable set associated with the test vector. Thus, upon drive enable set memory 108 receiving the selection code, the appropriate drive enable set may be accessed and the data comprising the test vector driven to DUT 200, with individual bits of each drive enable set activating the required drivers 140 for the selected test vector.

A similar process may be used in relation to compare enable sets. When data received by test system 300 from DUT 200 during a given cycle is to be compared with a test vector, the test vector is accessed from drive/compare data memory 106, while the appropriate selection code is accessed from selection code memory 107. The selection code is then used to select an associated compare enable set from compare enable set memory 118. The compare enable set is then used to enable or disable comparisons to the received data.

It should be noted that in some embodiments, the drive and compare enable sets may be stored in the same physical memory within test system 300. Similarly, the selection codes and drive/compare data may also be stored in the same physical memory. In general, the memory in test system 300 may be arranged in any manner desired that is suitable for providing the necessary drive/compare data, selection codes, and enable sets as discussed above.

While the embodiment illustrated in FIG. 2 has been discussed in reference to driving/receiving logic 0's and logic 1's to/from DUT 200, other types of test information may also be driven to or received from DUT 200. For example, test system 300 may be configured to drive signals at certain fixed voltages or may be configured to drive logic values strongly or weakly. Test system 300 could further be configured to drive signals in particular formats, e.g., driving a logic 0 for part of a period and a logic 1 for another part of the period, or multiple transitions therebetween in a given period. Signals may also be driven to DUT 200 at certain points within a period (e.g., for testing timing margins). With regard to comparing data received from DUT 200 to expected values (or ranges of values), test system 300 may be configured to compare voltages or currents, comparing logic received with expected values under specified current loading conditions, and so forth.

Figure 3:
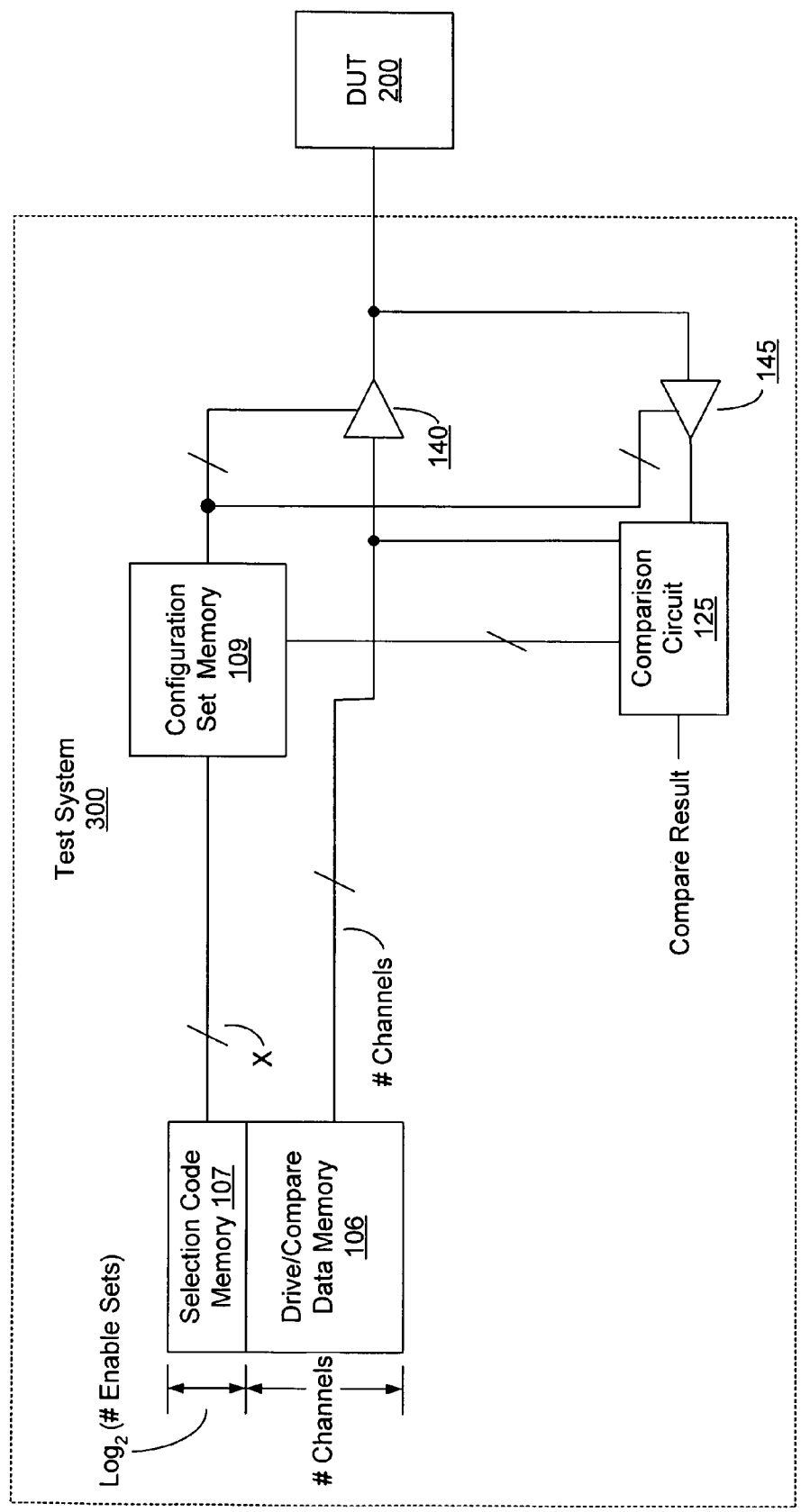
FIG. 3 is a drawing of an alternate embodiment of a test system.

In general, test system 300 may be configured to test a wide variety of parameters, and thus memories for storing drive enable sets and compare enable sets may be either incorporated into or replaced by one or more memories configured for configuration sets. FIG. 3 illustrates an alternate embodiment of test system 300 having a single configuration set memory 109 in lieu of drive enable set memory 108 and compare enable set memory 118 in the embodiment of FIG. 2. Configuration set memory 109 may store drive enable sets and/or compare enable sets as previously discussed. In addition, configuration set memory 109 may also store additional information regarding signals to be driven to DUT 200 (e.g., drive strength of signals) and/or information regarding signals received from DUT 200 (e.g., current load). In other words, configuration set memory 109 stores configuration sets that may include information such as drive enable sets, compare enable sets, drive/receive format information, signal strength information, current load information, timing information, and any other information required to perform a given test. Each selection code stored in selection code memory 107 is associated with one or more configuration sets. As with the drive enable sets and compare enable sets discussed above, only a single instance of each configuration set that is common to two or more test vectors need be stored in configuration set memory 109.

A further embodiment is possible and contemplated in which Configuration Set Memory 109 is implemented as multiple configuration set memories, each associated with a specific part of the test system. In addition multiple corresponding selection code memories may be used to source multiple selection codes per test vector.

Figure 4:
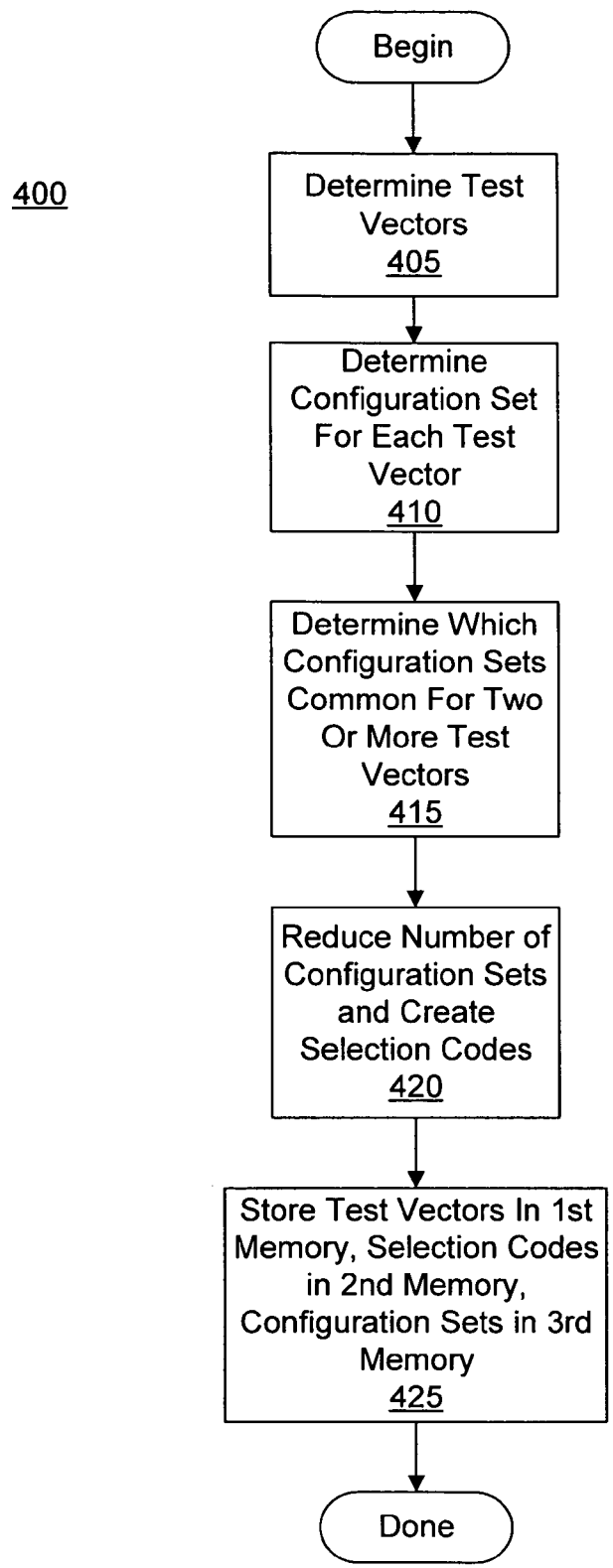
FIG. 4 is a flow diagram of one embodiment of a method for reducing the amount of pattern memory required in a test system.

FIG. 4 is a flow diagram of one embodiment of a method for reducing the amount of pattern memory required in a test system. Method 400 begins with the determination of test vectors that are to be used in communications between a test system and a DUT (405). The test vectors may include data to be driven to the DUT, data to be compared with data received from the DUT, or both.

Once each of the test vectors has been determined an associated configuration set is determined for each test vector (410). For test vectors to be driven to the DUT, a configuration set includes drive enable information indicating which drivers are to be enabled when the test vectors are driven to the DUT. For test vectors to be compared with data received from the DUT, a configuration set includes information indicating which comparison circuits are to be enabled. Configuration sets may also include additional information defining various voltage, current, and/or timing parameters for signals driven or received from the DUT as well as signal formatting information, as discussed above in reference to FIG. 3.

After generating the configuration sets, a determination is made indicating which of the configuration sets is common for two or more test vectors (415). Each configuration set is associated with at least one test vector. However, some of the configuration sets may be associated with two or more test vectors. There is no theoretical limit to the number of test vectors that may be associated with a given configuration set, and in fact this number is limited only by the specific implementation. Having completed the determination of the configuration sets, the total number thereof can be reduced until each configuration set is unique with respect to each of the other remaining configuration sets. Reducing the number of configuration sets may be performed in conjunction with the creation of selection codes (420). Selection codes may be used to provide an association, or mapping, between test vectors and configuration sets. The number of unique selection codes is dependent upon the number of unique configuration sets, although each test vector is associated with a selection code. However, since the number of unique configuration sets is less than the number of test vectors (substantially so in various embodiments), the number of bits required for each selection code may be less than that required for each test vector. Once the reduction of configuration sets and the generation of selection codes is complete, the test vectors may be stored in a first memory, the selection codes in a second memory, and the configuration sets in a third memory. It should be noted that the designation of first, second, and third memories (and any additional memories) may be a functional partition, and does not necessarily indicate separate physical memories. However, embodiments wherein the memories are partitioned both in a functional and a physical manner are possible and contemplated.

Figure 5:
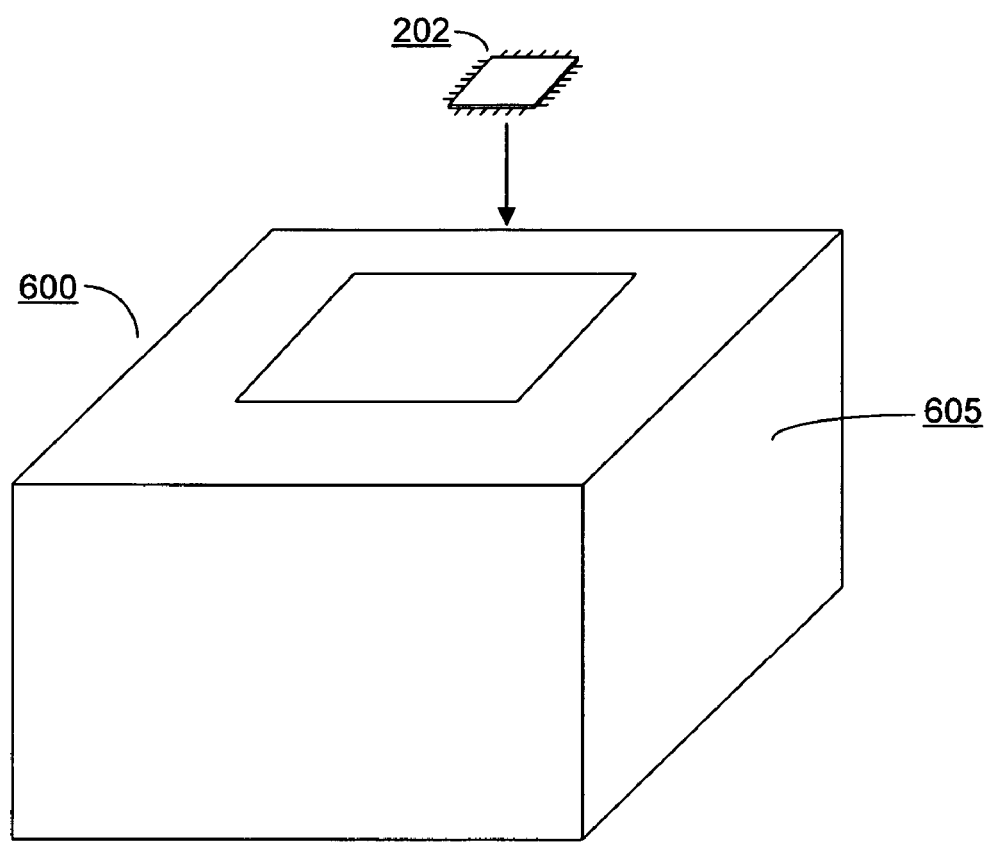
FIG. 5 is a drawing of one embodiment of a digital test system for testing integrated circuits.
Figure 6:
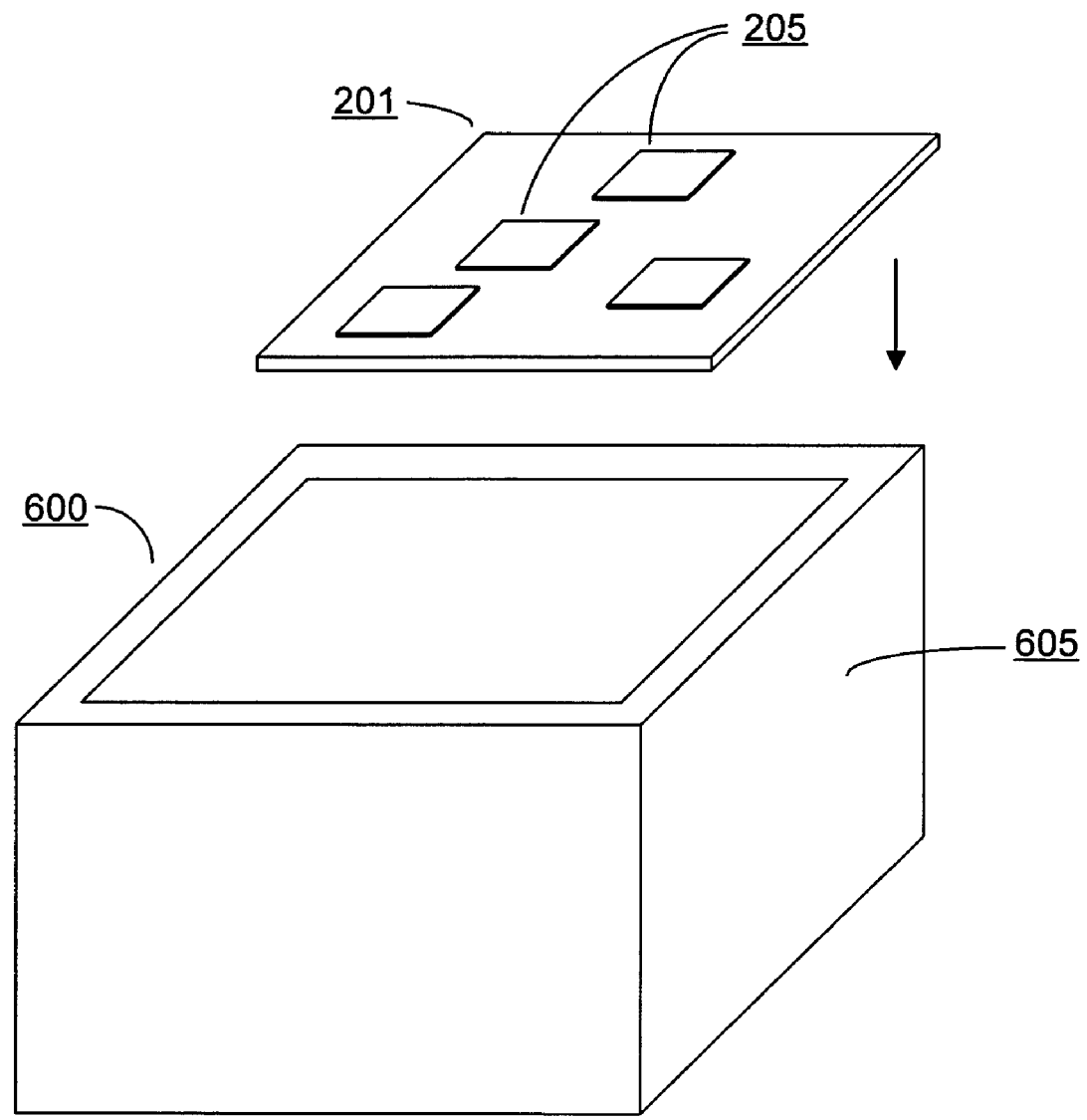
FIG. 6 is a drawing of one embodiment of a digital test system for testing printed circuit assemblies.

FIG. 5 is a drawing of one embodiment of a digital test system for testing integrated circuits, while FIG. 6 is a drawing of one embodiment of a digital test system for testing printed circuit assemblies. Either of these test systems may be configured to utilize the method and apparatus for reducing the number of drive enable sets and/or compare enable sets that may be required for use with test vectors and compare enable vectors, respectively. In the embodiment shown in FIG. 5, test system 600 is configured for testing DUT 202, which is an integrated circuit. Test system 600 may include an equipment bay 605, which may include memory and logic circuits in accordance with the test systems discussed above. Test system 600 of FIG. 6 is similar to that of FIG. 5 except in that DUT 201 is a printed circuit assembly having one or more integrated circuits 205 mounted thereupon. However, the test systems illustrated may still utilize the memory and logic circuits discussed above when enabling drivers to drive test vectors to the DUT or when enabling compare data vectors to data received from the DUT. The test systems may also utilized additional information in configuration sets, as discussed above.

The test systems illustrated in FIG. 5 and FIG. 6 are examples of test systems that may utilize the method and apparatus discussed herein. Broadly speaking, the method and apparatus discussed herein may be applied to any test system wherein a number of test vectors are transmitted to a DUT, received therefrom, or both, and wherein additional configuration information (e.g., drive enable, compare enable, etc.) may accompany test vectors.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A test system comprising:
a plurality of interface circuits, wherein the test system is configured to communicate with a device under test (DUT) through the plurality of interface circuits;
a first memory configured to store a plurality of test vectors, wherein each of the plurality of test vectors includes a plurality of bits;
a second memory configured to store a plurality of selection codes; and
a third memory configured to store a plurality of configuration sets, wherein each of the plurality of selection codes indicates an association between one of the plurality of test vectors and one of the plurality of configuration sets, wherein each configuration set is associated with one or more of the plurality of test vectors, wherein each configuration set includes configuration information for configuring each of the plurality of interface circuits for an associated test vector during communications with the DUT, and wherein each of the plurality of configuration sets is unique with respect to other ones of the plurality of configuration sets;
wherein the number of configuration sets stored in the third memory is less than a number of test vectors stored in the first memory.

2. The test system as recited in claim 1, wherein each configuration set includes enable information indicating which of one or more of the plurality of interface circuits is to be enabled for one or more associated test vectors.

3. The test system as recited in claim 2, wherein the plurality of interface circuits includes a plurality of drivers, and wherein one or more of the plurality of configuration sets includes driver enable information indicating which of the plurality of drivers are to be enabled for driving an associated test vector from the test system to the DUT.

4. The test system as recited in claim 3, wherein one or more of the plurality of configuration sets includes information indicating at least one voltage level at which signals should be driven to the DUT through enabled drivers.

5. The test system as recited in claim 3, wherein one or more of the plurality of configuration sets includes information indicating a signal strength for each bit of driven to the DUT for a given test vector through an enabled driver.

6. The test system as recited in claim 3, wherein one or more of the plurality of configuration sets includes timing information for each bit of a test vector that is to be driven to the DUT through an enabled driver.

7. The test system as recited in claim 3, wherein one or more of the plurality of configuration sets includes format information for a signal driven to the DUT through an enabled driver, wherein the format information indicates a state of the signal for a given portion of a test period.

8. The test system as recited in claim 3, wherein each driver is configured to output a high impedance state when not enabled.

9. The test system as recited in claim 2, wherein the plurality of interface circuits includes a plurality of receivers, and wherein the test system further includes a plurality of comparison circuits, and wherein the plurality of configuration sets includes compare enable information indicating which of the plurality of comparison circuits is to be enabled for comparing data received from the DUT to an associated test vector.

10. The test system as recited in claim 9, wherein one or more of the plurality of configuration sets includes current loading information indicating a current load to be applied to a signal received from the DUT.

11. The test system as recited in claim 9, wherein one or more of the plurality of configuration sets includes voltage information for comparing an expected voltage to a voltage of a signal received from the DUT.

12. The test system as recited in claim 9, wherein one or more of the plurality of configuration sets includes timing information for comparing to a timing of a signal received from the DUT.

13. The test system as recited in claim 1, wherein the test system includes an internal bus, and wherein each of the plurality of interface circuits is coupled to the internal bus.

14. The test system as recited in claim 13, wherein the internal bus includes a first plurality of signal paths coupled between the first memory and the plurality of interface circuits.

15. The test system as recited in claim 14, wherein the internal bus includes a second plurality of signal paths coupled between the second memory and the third memory, wherein selection codes are conveyed from the second memory to the third memory on the second plurality of signal paths.

16. The test system as recited in claim 15, wherein the number of signal paths in the second plurality is less than the number of signal paths in the first plurality.

17. A method comprising:
generating a plurality of test vectors for a test system in communications with a device under test (DUT), wherein each test vector includes a plurality of bits;
generating a first plurality of configuration sets, wherein each configuration set includes information for configuring each of the plurality of interface circuits for an associated test vector during communications with the DUT;
determining which of the plurality of configuration sets is common for two or more of the plurality of test vectors;
reducing the first plurality of configuration sets into a second plurality of configuration sets based on said determining, wherein each configuration set in the second plurality of configuration sets is unique with respect to every other configuration set of the second plurality;
generating a plurality of selection codes, wherein each selection code associates one of the plurality of configuration sets with one or more of the plurality of test vectors;
storing the plurality of test vectors in a first memory of the test system;
storing the plurality of selection codes in a second memory of the test system; and
storing the second plurality of configuration sets in a third memory of the test system.

18. The method as recited in claim 17, wherein each of the plurality of configuration sets includes enable information for indicating which of the plurality of interface circuits is to be enabled for an associated test vector during communications with the DUT.

19. The method as recited in claim 18, wherein the plurality of interface circuits includes a plurality of drivers, and wherein one or more of the plurality of configuration sets includes driver enable information indicating which of the plurality of drivers are to be enabled for driving an associated test vector from the test system to the DUT.

20. The method as recited in claim 19, wherein one or more of the plurality of configuration sets includes information indicating at least one voltage level at which signals should be driven to the DUT through the plurality of interface circuits.

21. The method as recited in claim 19, wherein one or more of the plurality of configuration sets includes information indicating a signal strength for each bit of driven to the DUT for a given test vector through an enabled interface circuit.

22. The method as recited in claim 19, wherein one or more of the plurality of configuration sets includes timing information for each bit of a test vector that is to be driven to the DUT through an enabled interface circuit.

23. The method as recited in claim 19, wherein one or more of the plurality of configuration sets includes format information for a signal driven to the DUT through an enabled interface circuit, wherein the format information indicates a state of the signal for a given portion of a test period.

24. The method as recited in claim 19, wherein one or more of the configuration sets includes compare enable information indicating which of a plurality of comparison circuits in the test system is to be enabled for comparing data received from the DUT to an associated test vector.

25. The method as recited in claim 19, wherein one or more of the plurality of configuration sets includes current loading information indicating a current load to be applied to a signal received from the DUT.

26. The method as recited in claim 19, wherein one or more of the plurality of configuration sets includes voltage information for comparing an expected voltage to a voltage of a signal received from the DUT.

27. The method as recited in claim 19, wherein one or more of the plurality of configuration sets includes timing information for comparing to a timing of a signal received from the DUT.

28. The method as recited in claim 17, wherein a number of configuration sets in the second plurality of configuration sets is less than a number of configuration sets in the first plurality of configuration sets.

29. A method for operating a test system, the method comprising:
retrieving one of a plurality of test vectors from a first memory of a test system, wherein each of the plurality of test vectors includes a plurality of bits;
retrieving one of a plurality of selection codes from a second memory of the test system, wherein each of the plurality of selection codes is associated with one of the plurality of test vectors;
retrieving one of a plurality of configuration sets from a third memory based on the retrieved one of the plurality of selection codes, wherein each of the plurality of configuration sets is associated with one or more of the plurality of test vectors, wherein each configuration set includes information for configuring each of a plurality of interface circuits of the test system for communications with a device under test (DUT) for an associated test vector, and wherein each of the plurality of configuration sets is unique with respect to other ones of the plurality of configuration sets; and
configuring the plurality of interface circuits based on the retrieved one of the plurality of configuration sets.

30. The method as recited in claim 29, wherein each configuration set includes enable information indicating which of one or more of the plurality of interface circuits is to be enabled for one or more associated test vectors.

31. The method as recited in claim 30, wherein the plurality of interface circuits includes a plurality of drivers, and wherein one or more of the plurality of configuration sets includes driver enable information indicating which of the plurality of drivers are to be enabled for driving an associated test vector from the test system to the DUT.

32. The method as recited in claim 31, wherein one or more of the plurality of configuration sets includes information indicating at least one voltage level at which signals should be driven to the DUT through enabled drivers.

33. The method as recited in claim 31, wherein one or more of the plurality of configuration sets includes information indicating a signal strength for each bit of driven to the DUT for a given test vector through an enabled driver.

34. The method as recited in claim 31, wherein one or more of the plurality of configuration sets includes timing information for each bit of a test vector that is to be driven to the DUT through an enabled driver.

35. The method as recited in claim 31, wherein one or more of the plurality of configuration sets includes format information for a signal driven to the DUT through an enabled driver, wherein the format information indicates a state of the signal for a given portion of a test period.

36. The method as recited in claim 31 further comprising each driving outputting a high impedance when not enabled.

37. The method as recited in claim 30, wherein the plurality of interface circuits includes a plurality of receivers, and wherein the test system further includes a plurality of comparison circuits, and wherein the plurality of configuration sets includes compare enable information indicating which of the plurality of comparison circuits is to be enabled for comparing data received from the DUT to an associated test vector.

38. The method as recited in claim 37, wherein one or more of the plurality of configuration sets includes current loading information indicating a current load to be applied to a signal received from the DUT.

39. The method as recited in claim 37, wherein one or more of the plurality of configuration sets includes voltage information for comparing an expected voltage to a voltage of a signal received from the DUT.

40. The method as recited in claim 37, wherein one or more of the plurality of configuration sets includes timing information for comparing to a timing of a signal received from the DUT.

41. The test system as recited in claim 29, wherein the number of configuration sets in the plurality of configuration sets is less than the number of test vectors in the plurality of test vectors.

* * * * *